US012279489B2

(12) United States Patent
Kanehiro et al.

(10) Patent No.: US 12,279,489 B2
(45) Date of Patent: Apr. 15, 2025

(54) DISPLAY DEVICE AND HAVING COMMON ELECTRODE WITH METAL NANOWIRES

(71) Applicant: SHARP KABUSHIKI KAISHA, Sakai (JP)

(72) Inventors: Masayuki Kanehiro, Sakai (JP); Youhei Nakanishi, Sakai (JP); Hiroki Imabayashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 902 days.

(21) Appl. No.: 17/434,581

(22) PCT Filed: Mar. 6, 2019

(86) PCT No.: PCT/JP2019/008959
§ 371 (c)(1),
(2) Date: Aug. 27, 2021

(87) PCT Pub. No.: WO2020/179033
PCT Pub. Date: Sep. 10, 2020

(65) Prior Publication Data
US 2022/0140057 A1 May 5, 2022

(51) Int. Cl.
*H10K 59/131* (2023.01)
*H10K 50/84* (2023.01)
*H10K 59/122* (2023.01)

(52) U.S. Cl.
CPC ......... *H10K 59/131* (2023.02); *H10K 50/841* (2023.02); *H10K 59/122* (2023.02)

(58) Field of Classification Search
CPC ... H10K 59/131; H10K 59/122; H10K 50/841
See application file for complete search history.

(56) References Cited

U.S. PATENT DOCUMENTS

| | | | |
|---|---|---|---|
| 2009/0233086 A1 | 9/2009 | Hirai | |
| 2012/0211739 A1* | 8/2012 | Koyama | H10K 71/60 257/E51.026 |
| 2015/0228927 A1 | 8/2015 | Kim | |
| 2015/0380669 A1* | 12/2015 | Liang | H10K 30/87 438/82 |
| 2016/0365395 A1* | 12/2016 | Xu | H10K 50/8445 |
| 2017/0288162 A1 | 10/2017 | Akiyama et al. | |
| 2018/0158894 A1 | 6/2018 | Park et al. | |

FOREIGN PATENT DOCUMENTS

| | | |
|---|---|---|
| CN | 103700446 A | 4/2014 |
| CN | 106340532 A | 1/2017 |
| JP | 2009-224183 A | 10/2009 |
| JP | 2017-183510 A | 10/2017 |

* cited by examiner

*Primary Examiner* — Lex H Malsawma
(74) *Attorney, Agent, or Firm* — ScienBiziP, P.C.

(57) ABSTRACT

A display device includes a display region and a frame region surrounding the display region. The display device includes a TFT layer, a light-emitting element layer formed with a plurality of light-emitting elements each including a first electrode, a light-emitting layer, and a second electrode, and having a luminescent color different from each other, and a sealing layer including an organic film and configured to seal the light-emitting element layer. The second electrode is an electrode common to the plurality of light-emitting elements, and includes metal nanowires which are mesh-shaped.

19 Claims, 10 Drawing Sheets

DISPLAY DEVICE AND HAVING COMMON ELECTRODE WITH METAL NANOWIRES

TECHNICAL FIELD

The disclosure relates to a display device and a method for manufacturing the display device.

BACKGROUND ART

PTL 1 discloses a configuration in which a semi-light-transmitting metal thin film such as a magnesium silver alloy, or a light-transmitting metal oxide thin film such as ITO is used as a second electrode (cathode electrode), which is an upper electrode, in a top-emitting type organic EL display device.

CITATION LIST

Patent Literature

PTL 1: JP 2017-183510 A (published Oct. 5, 2017)

SUMMARY

Technical Problem

In the configuration disclosed in PTL 1, when the semi-light-transmitting metal thin film such as a magnesium silver alloy is used, a transmittance of light is low, and as a result of some of the light being reflected, a cavity effect is generated, which may cause a problem by which viewing angle characteristics deteriorate. On the other hand, when the transparent thin metal oxide film such as ITO is used, when forming the light-transmitting thin metal oxide film by sputtering, a light-emitting layer or the like may be damaged, which may cause a problem by which light-emission characteristics deteriorate.

Solution to Problem

A display device according to an embodiment of the disclosure includes a display region and a frame region surrounding the display region. The display device includes a TFT layer, a light-emitting element layer formed with a plurality of light-emitting elements each including a first electrode, a light-emitting layer, and a second electrode, and having a different luminescent colors different from each other, and a sealing layer including an organic film and configured to seal the light-emitting element layer. The second electrode is an electrode common to the plurality of light-emitting elements, and includes metal nanowires which are mesh-shaped.

Advantageous Effects of Disclosure

According to an aspect of the disclosure, a display device can be realized that can improve viewing angle characteristics while preventing a deterioration in light-emission characteristics.

DESCRIPTION OF EMBODIMENTS

First Embodiment

Figure 1:
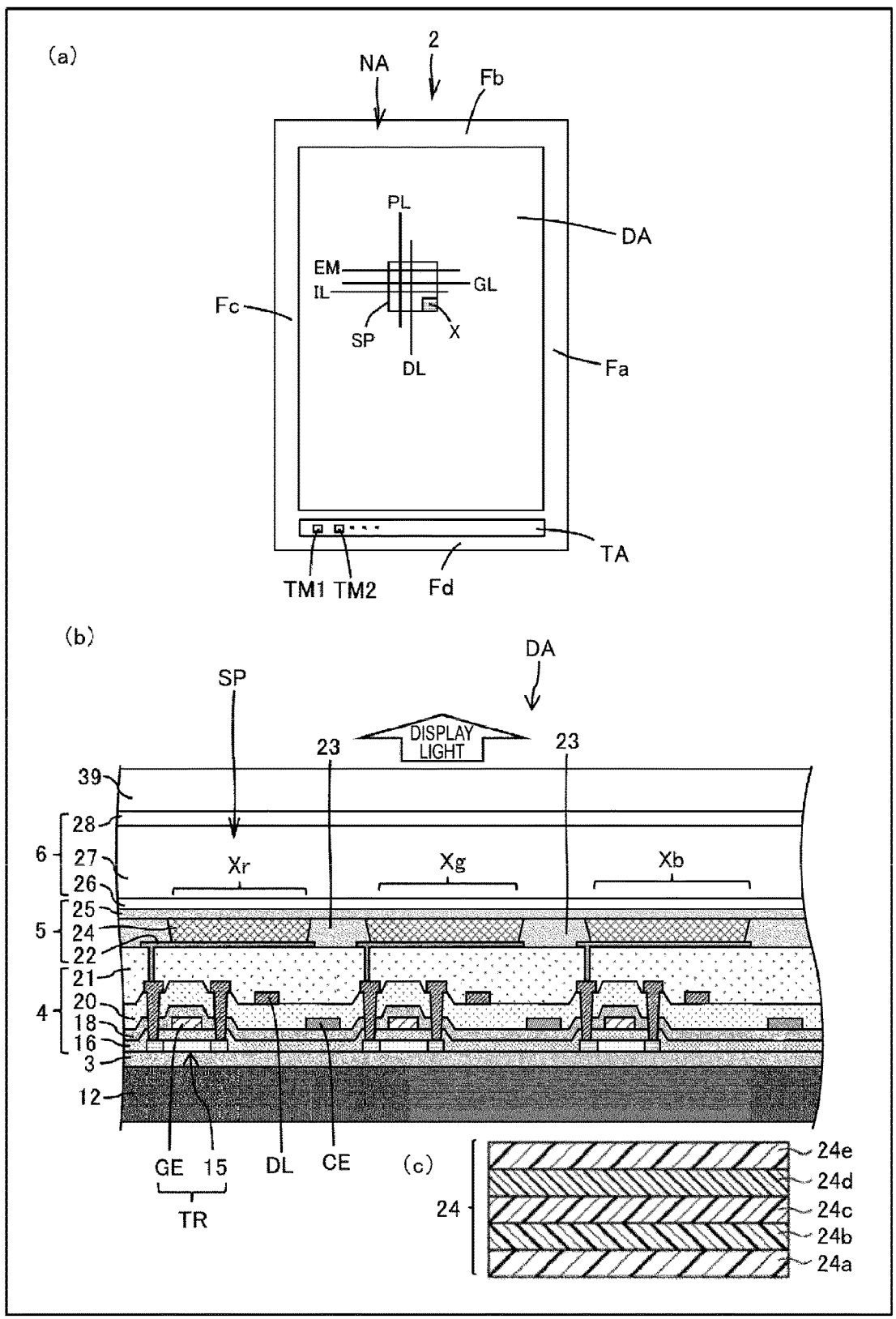
FIG. 1(a) is a schematic view illustrating a configuration of a display device according to a first embodiment.
FIG. 1(b) is a cross-sectional view illustrating the configuration of the display device according to the first embodiment.
FIG. 1(c) is a cross-sectional view illustrating a configuration of an EL layer.

Hereinafter, "the same layer" means that the layer is formed in the same process (film formation process), "a lower layer" means that the layer is formed in an earlier process than the process in which the layer to compare is formed, and "an upper layer" means that the layer is formed in a later process than the process in which the layer to compare is formed.

FIG. 1(a) is a schematic view illustrating a configuration of a display device according to a first embodiment, FIG. 1(b) is a cross-sectional view illustrating the configuration of the display device according to the first embodiment, and FIG. 1(c) is a cross-sectional view illustrating a configuration of an EL layer.

In a display device 2, a barrier layer 3, a TFT layer 4, a top-emitting type light-emitting element layer 5, and a scaling layer 6 are provided in this order on a base material 12, and a plurality of subpixels SP are formed in a display region DA. A frame region NA surrounding the display region DA includes four side edges Fa to Fd, and a terminal portion TA for mounting an electronic circuit board (an IC chip, a FPC, or the like) is formed at the side edge Fd. The terminal portion TA includes a plurality of terminals TM1, TM2. A driver circuit (not illustrated) may be formed at each of the side edges Fa to Fd.

The base material 12 may be a glass substrate, or a flexible substrate including a resin film such as polyimide. The flexible substrate can also be constituted by double-layered resin films, and an inorganic insulating film sandwiched therebetween. A film such as PET may be adhered to a lower face of the base material 12. By using the flexible substrate for the base material 12, the flexible (flexible) display device 2 can also be formed.

The barrier layer 3 is a layer that inhibits foreign matter such as water and oxygen from entering the TFT layer 4 and the light-emitting element layer 5, and can be constituted by a silicon oxide film, a silicon nitride film, or a silicon oxynitride film, or by a layered film of these, formed by chemical vapor deposition (CVD).

As illustrated in FIG. 1(b), the TFT (thin film transistor) layer 4 includes a semiconductor layer (including a semiconductor film 15) as an upper layer overlying the barrier layer 3, an inorganic insulating film 16 (a gate insulating film) as an upper layer overlying the semiconductor layer, a first metal layer (including gate electrodes GE) as an upper layer overlying the inorganic insulating film 16, an inorganic insulating film 18 as an upper layer overlying the first metal layer, a second metal layer (including capacitance electrodes CE) as an upper layer overlying the inorganic insulating film 18, an inorganic insulating film 20 as an upper layer overlying the second metal layer, a third metal layer (including data signal lines DL) as an upper layer overlying the inorganic insulating film 20, and a flattening film 21 as an upper layer overlying the third metal layer.

The semiconductor layer is constituted, for example, by amorphous silicon, LTPS (low-temperature polysilicon), or an oxide semiconductor, and a thin film transistor TR is constituted so as to include the gate electrodes GE and the semiconductor film 15.

In the display region DA, a light-emitting element X and a pixel circuit are provided for each of the subpixels SP, and this pixel circuit and a wiring line connected thereto are formed in the TFT layer 4. Examples of the wiring line connected to the pixel circuit include a scanning signal line GL and a light emission control line EM formed in the first metal layer, an initialization power source line IL formed in the second metal layer, the data signal line DL and a high-voltage side power source line PL formed in the third metal layer, and the like. The pixel circuit includes a drive transistor that controls a current of the light-emitting element, a write transistor electrically connected to the scanning signal line, a light emission control transistor electrically connected to the light emission control line, and the like.

The first metal layer, the second metal layer, and the third metal layer are each constituted by a single layer film or a multi-layered film of metal, the metal including at least one of aluminum, tungsten, molybdenum, tantalum, chromium, titanium, and copper, for example.

Each of the inorganic insulating films 16, 18, 20 can be constituted, for example, by a silicon oxide (SiOx) film, a silicon nitride (SiNx) film, or a layered film of these, formed by using a CVD method. The flattening film 21 can be constituted, for example, by a coatable organic material such as polyimide or an acrylic resin.

The light-emitting element layer 5 includes a first electrode (anode electrode) 22 as an upper layer overlying the flattening film 21, an edge cover film 23 having insulating properties and covering an edge of the first electrode 22, an electroluminescent (EL) layer 24 as an upper layer overlying the edge cover film 23, and a second electrode 25 (cathode electrode) as an upper layer overlying the EL layer 24. The edge cover film 23 is formed, for example, by applying an organic material such as polyimide or an acrylic resin, and then patterning the organic material by photolithography.

A light-emitting element Xr (red), a light-emitting element Xg (green), and a light-emitting element Xb (blue) having mutually different luminescent colors are formed in the light-emitting element layer 5, and each of the light-emitting elements includes the first electrode 22 having an island shape, the EL layer 24 (including the light-emitting layer), and the second electrode 25. The second electrode 25 is a solid-like common electrode common to the plurality of light-emitting elements.

The light-emitting elements Xr, Xg, Xb may each be, for example, an organic light-emitting diode (OLED) including an organic layer as a light-emitting layer, or may be a quantum dot light-emitting diode (QLED) including a quantum dot layer as the light-emitting layer.

For example, as illustrated in FIG. 1(c), the EL layer 24 is constituted by layering a hole injection layer 24a, a hole transport layer 24b, a light-emitting layer 24c, an electron transport layer 24d, and an electron injection layer 24e in this order, from the lower layer side. An electron blocking layer and a hole blocking layer may also be provided in the EL layer 24. The light-emitting layer is formed in an island shape at an opening (for each of the subpixels) of the edge cover 23 by vapor deposition, an ink-jet method, or a photolithographic method. The other layers are each formed in an island shape or a solid-like shape (a common layer). Further, a configuration can also be adopted in which at least one layer, of the hole injection layer, the hole transport layer, the electron transport layer, and the electron injection layer, is not formed (to be described below).

Although FIG. 1 illustrates a configuration in which the anode electrode (the first electrode 22), the EL layer 24, and the negative electrode (the second electrode 25) are provided in this order from the TFT layer 4 side, the configuration is not limited thereto. A configuration may also be adopted in which the cathode electrode, the EL layer 24, and the anode electrode are provided in this order from the TFT layer 4 side. In this case, the EL layer 24 is constituted by layering the electron injection layer 24e, the electron transport layer 24d, the light-emitting layer 24c, the hole transport layer 24b, and the hole injection layer 24a in this order, from the lower layer side.

When the organic layer (light-emitting layer) of the OLED is formed by vapor deposition, a fine metal mask (FMM) is used. The FMM is a sheet (made of Invar material, for example) including a large number of openings, and an island-shaped light-emitting organic layer (corresponding to one subpixel) is formed of an organic material passing through one of the openings.

With respect to the quantum dot layer (light-emitting layer) of the QLED, an island-shaped quantum dot layer (corresponding to one subpixel) can be formed by applying a solution in which quantum dots are diffused in a solvent, and patterning the applied solution using an ink-jet method or a photolithographic method.

The first electrode 22 is constituted, for example, by layering Indium Tin Oxide (ITO), and silver (Ag) or an alloy containing Ag, and has light reflectivity. The second electrode 25 (cathode electrode) is constituted to include metal nanowires (silver nanowires, for example), and has high light-transmitting properties.

When each of the light-emitting elements Xr, Xg, Xb is the OLED, positive holes and electrons recombine inside the light-emitting layer in response to a drive current between the first electrode 22 and the second electrode 25, and light is emitted when excitons generated by this recombination transition to a ground state. Since the second electrode 25 has a high light-transmitting property and the first electrode 22 has light reflectivity, the light emitted from the EL layer 24 is directed upward to configure a top-emitting structure.

When each of the light-emitting elements Xr, Xg, Xb is the QLED, the positive holes and the electrons recombine inside the light-emitting layer in response to the drive current between the first electrode 22 and the second electrode 25, and light (fluorescence) is emitted when the excitons generated by this recombination transition from a conduction band level to a valence band level of the quantum dot.

A light-emitting element other than the above-described OLED or QLED (an inorganic light-emitting diode, or the like) may also be formed in the light-emitting element layer 5.

The sealing layer 6 has a light-transmitting property, and includes an inorganic sealing film 26 directly formed on the second electrode 25 (in contact with the second electrode 25), an organic film 27 as an upper layer overlying the inorganic sealing film 26, and an inorganic sealing film 28 as an upper layer overlying the organic film 27. The sealing layer 6 covering the light-emitting element layer 5 inhibits foreign matter such as water and oxygen from penetrating the light-emitting element layer 5.

The organic film 27 has a flattening effect and light-transmitting property, and can be formed, for example, by ink-jet application using a coatable organic material. The inorganic sealing films 26, 28 are inorganic insulating films and can each be constituted by a silicon oxide film, a silicon nitride film, a silicon oxynitride film, or a layered film of these, formed by CVD, for example.

A function film 39 has at least one of an optical compensation function, a touch sensor function, a protection function, and the like.

Figure 2:
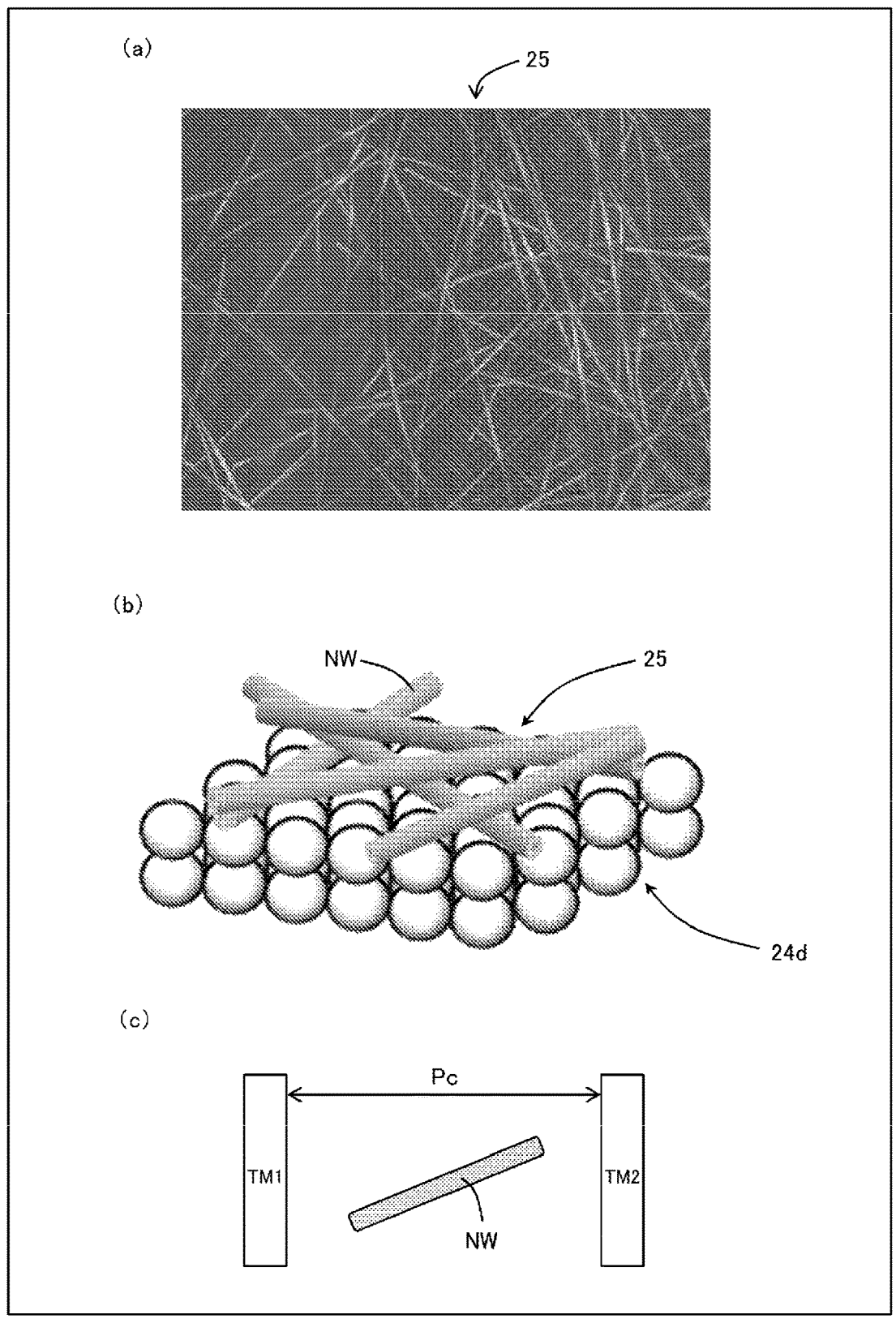
FIG. 2(a) is a photograph showing a configuration of a second electrode.
FIG. 2(b) is a perspective view illustrating the configuration of the second electrode.
FIG. 2(c) is a schematic view relating to the length of a metal nanowire.
Figure 3:
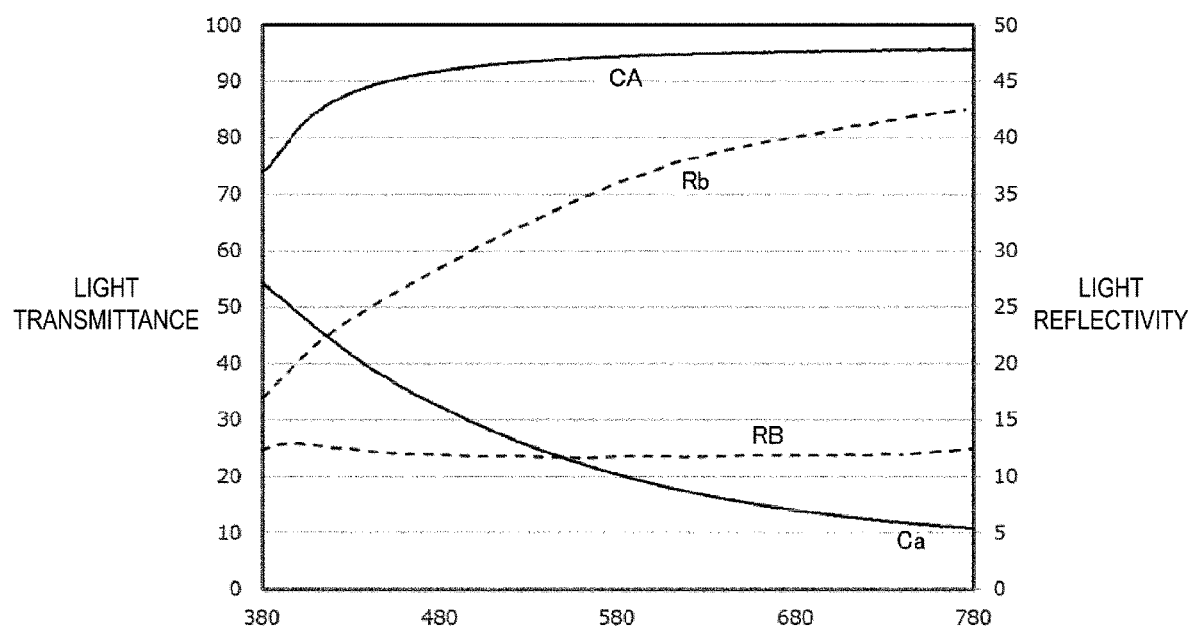
FIG. 3 is a graph showing an effect of the first embodiment.

FIG. 2(a) is a photograph showing a configuration of the second electrode, FIG. 2(b) is a perspective view illustrating the configuration of the second electrode, and FIG. 2(c) is a schematic view relating to the length of the metal nanowire. FIG. 3 is a graph showing an effect of the first embodiment.

In the first embodiment, since the second electrode 25 serving as an upper electrode is constituted by mesh-like silver nanowires NW, as illustrated in FIGS. 2(a) and (b), it can be seen that light transmittance (CA) of the second electrode 25 (the diameter of the silver nanowire=25 nm, and the maximum number of overlapping layers=5 layers) is higher than light transmittance (Ca) of a silver thin film electrode (having the thickness of 20 nm), which is a comparison target, in a wavelength region from 380 (nm) to 780 (nm), and exceeds 80% in a wavelength region from 400 (nm) to 780 (nm), as illustrated in FIG. 3. Further, it can be seen that light reflectivity (RB) of the second electrode 25 is lower than light reflectivity (Rb) of the silver thin film electrode, which is the comparison target, in the wavelength region from 380 (nm) to 780 (nm), and is less than 15% in the wavelength region from 400 (nm) to 780 (nm).

In the above-described manner, by constituting the second electrode 25, which is the common electrode, using the mesh-like silver nanowires NW, it is possible to improve light extraction efficiency in a top-emitting configuration and obtain good visual characteristics.

Note that the number of overlapping layers of the silver nanowires in the second electrode 25 is 2 to 8 layers, and is preferably 3 to 6 layers. The diameter (Φ) of the silver nanowire is 5 to 100 (nm), preferably 10 to 80 (nm), and more preferably 20 to 50 (nm). The length (trace length) of the silver nanowire is 1 to 100 (μm), preferably 5 to 50 (μm), and more preferably 8 to 30 (μm). Note that these values can be obtained through observation using a scanning electron microscope, or the like. The electrical resistance (surface resistance) of the silver nanowire is 5 to 200 (Ω/Sq), preferably 10 to 100 (Ω/Sq), and more preferably 10 to 50 (Ω/Sq).

The length (average trace length) of the metal nanowire, such as the silver nanowire NW, is desirably smaller than a distance (terminal gap width) Pc between the adjacent terminals TM1, TM2 of the terminal portion, as illustrated in FIG. 2(c). In this way, even when the metal nanowires are intermingled with the terminal portion when forming the second electrode, short-circuiting between the terminals TM1, TM2 due to the metal nanowire can be prevented.

In the first embodiment, Ag is used as the material of the metal nanowire of the second electrode, but the material is not limited thereto. The metal nanowire may be a single metal nanowire made of any one of Au, Al, and Cu, or a nanowire made of an alloy including two or more of Ag, Au, Al, and Cu.

Figure 4:
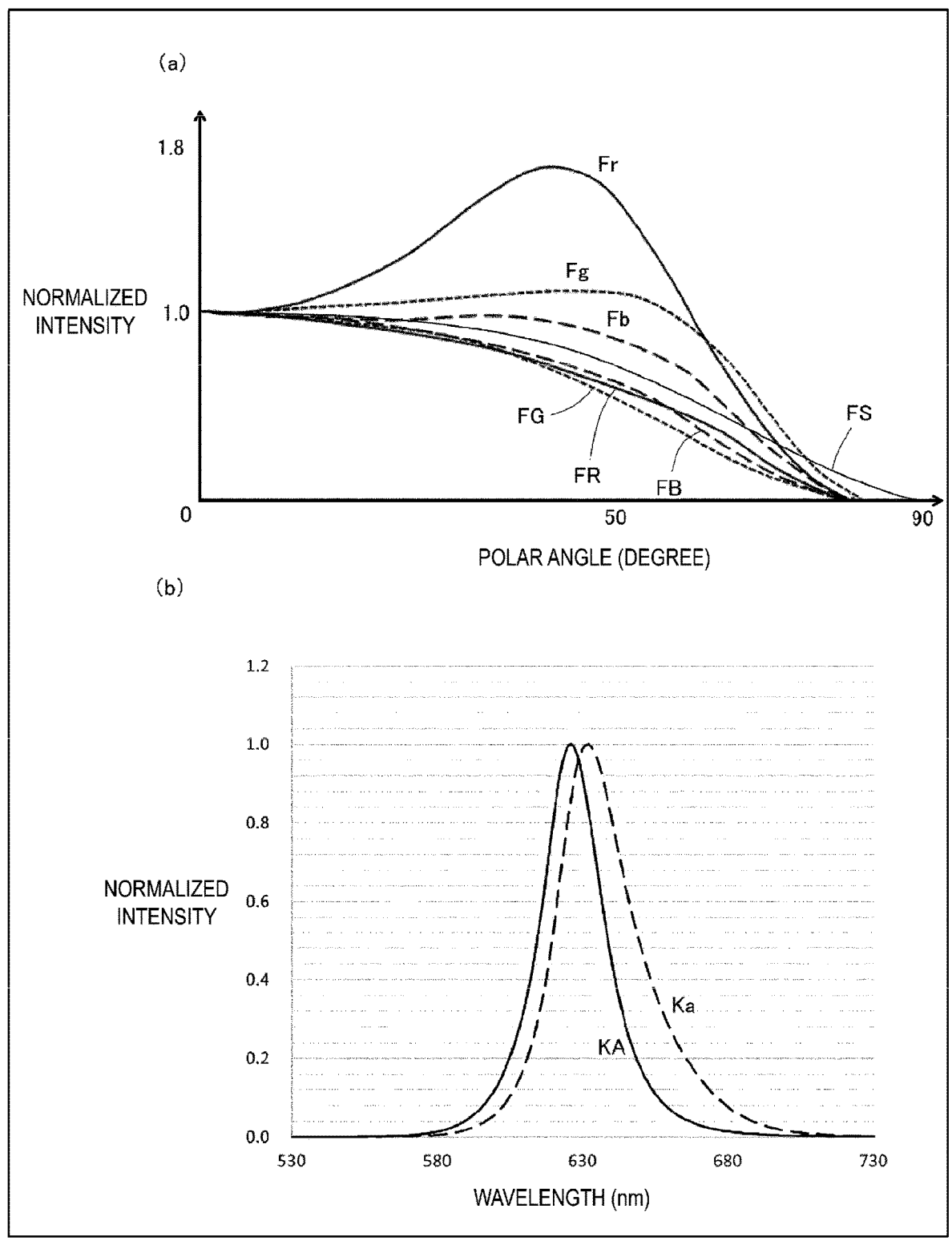
FIGS. 4(a) and (b) are graphs showing an effect of the second electrode (a metal nanowire electrode) when a light-emitting element includes a quantum dot light-emitting layer.

FIGS. 4(a) and (b) are graphs showing an effect of the second electrode (a metal nanowire electrode) when the light-emitting element includes a quantum dot light-emitting layer. As illustrated in FIG. 4(a), with respect to characteristics of a polar angle and a normalized light emission intensity, it can be seen that, compared with characteristics (a characteristic Fr of red, a characteristic Fg of green, and a characteristic Fb of blue) obtained when the quantum dot light-emitting layer is combined with the silver thin film electrode, characteristics (a characteristics FR of red, a characteristics FG of green, and a characteristics FB of blue) obtained when the quantum dot light-emitting layer is combined with the second electrode (metal nanowire electrode) 25 are becoming closer to Lambertian light distribution characteristics FS with respect to all three of the colors (the thicknesses of a carrier injection layer, a carrier transport layer, and the light-emitting layer are common among the colors). The Lambertian light distribution characteristics are ideal light distribution characteristics in which, when a vertical front face is 0°, the radiation intensity in an angle θ direction is expressed by the radiation intensity on the optical axis multiplied by cos θ.

As illustrated in FIG. 4(b), it can be seen that in a red light emission characteristic Ka obtained when the quantum dot light-emitting layer (of red light emission, for example, with the PL peak wavelength of 620 nm and the half-width of 25 nm) is combined with the silver thin film electrode having a large light reflectivity, due to an adverse effect arising from a cavity effect (resonant effect) between electrodes, the peak wavelength shifts toward the long wavelength side and exceeds 630 nm and the half-width increases up to 32 nm, but in a red light emission characteristic KA obtained when the quantum dot light-emitting layer (of red light emission) is combined with the second electrode (the metal nanowire electrode), the peak wavelength hardly changes, with the peak wavelength being at an appropriate position (approximately 620 nm) and the half-width being approximately 25 nm.

In this way, when the metal nanowire having a high transmittance is used for the second electrode, the cavity effect hardly occurs. Thus, by applying the configuration to the QLED, which is adversely affected by the cavity effect, a significant effect (in other words, an effect of improving the viewing angle characteristics) can be obtained. Further, since the cavity effect hardly occurs, as illustrated in FIG. 4(a), the film thickness of each of the layers between the first electrode 22 and the second electrode 25 can be brought closer to the Lambertian light distribution without aligning the film thicknesses to optimal values between the light-emitting elements Xr, Xg, Xb, and the film thickness of each of the layers is made common. As a result, the display device 2 having excellent viewing angle characteristics can be easily manufactured.

Figure 5:
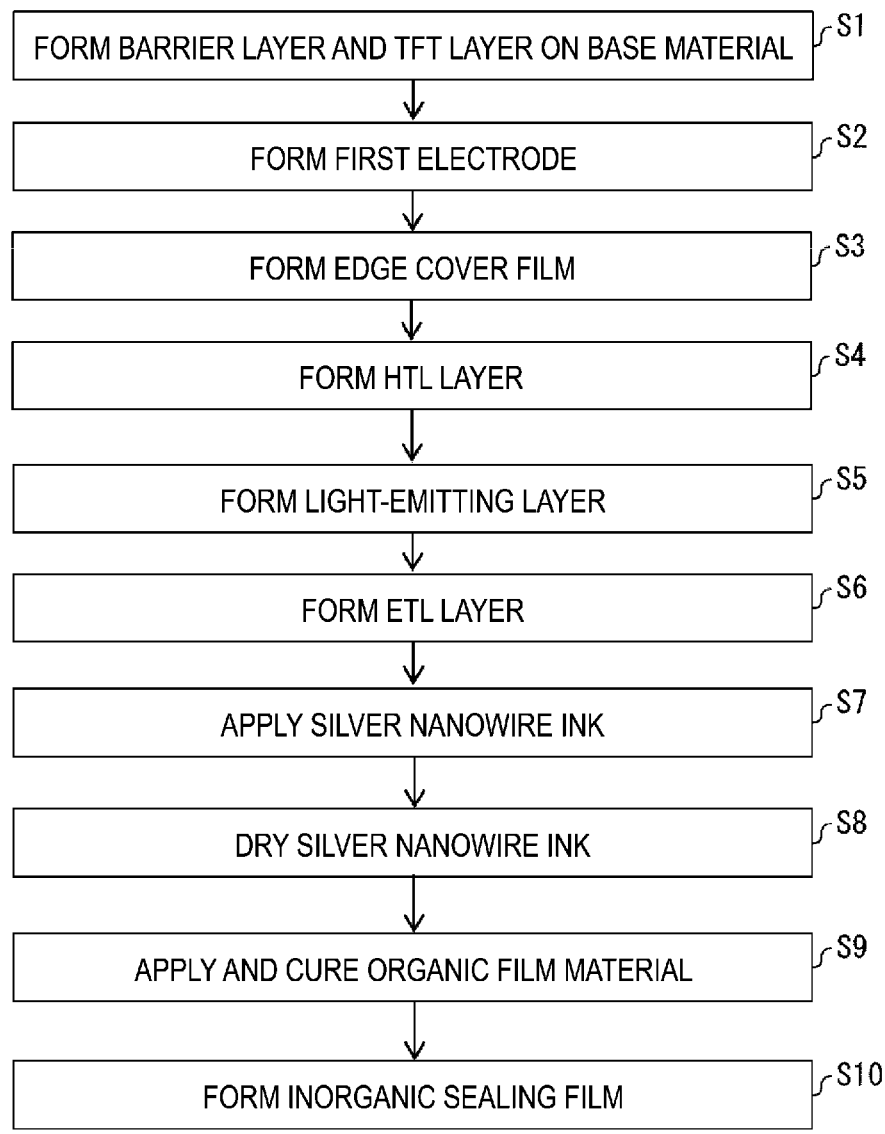
FIG. 5 is a flowchart illustrating a method for manufacturing the display device.

FIG. 5 is a flowchart illustrating a method for manufacturing the display device 2. At step S1, the barrier layer 3 and the TFT layer 4 are formed on the base material 12. At step S2, the first electrode 22 is formed on the flattening film 21 using the sputtering and the photolithographic method. At step S3, the edge cover film 23 is formed. At step S4, the HTL layer (hole transport layer) is formed. At step S5, the light-emitting layer (the quantum dot light-emitting layer, for example) is formed. At step S6, the ETL layer (electron transport layer, for example, a zinc oxide nanoparticle layer) is formed. At step S7, a silver nanowire ink in which silver nanowires are dispersed in a solvent is applied onto the ETL layer. The silver nanowire ink may include a binder, a dispersing agent, and other additives. At step S8, the applied silver nanowire ink is dried (removal of the solvent) to form, on the ETL layer, the second electrode 25 constituted by the mesh-like silver nanowires NW, as illustrated in FIG. 2. At step S9, the organic film 27 is formed by applying the material (precursor) of the organic film 27 using an ink-jet method, and curing the material so as to directly cover the second electrode 25. At step S10, the inorganic sealing film 28 is formed as an upper layer overlying the organic film 27.

In the first embodiment, since the second electrode 25 is formed by applying and drying the silver nanowire ink, compared with a case in which the sputtering or the vapor deposition is used, there is an advantage in that an impact on the light-emitting layer (the quantum dot light-emitting layer, for example) is small. As a result, it is possible to prevent a deterioration in the light emission characteristics of the display device 2.

Further, since the second electrode 25 constituted by the mesh-like silver nanowires NW is more flexible than a generic Ag thin film, or the like, the second electrode 25 is preferable as the common electrode of the flexible display device 2.

Figure 6:
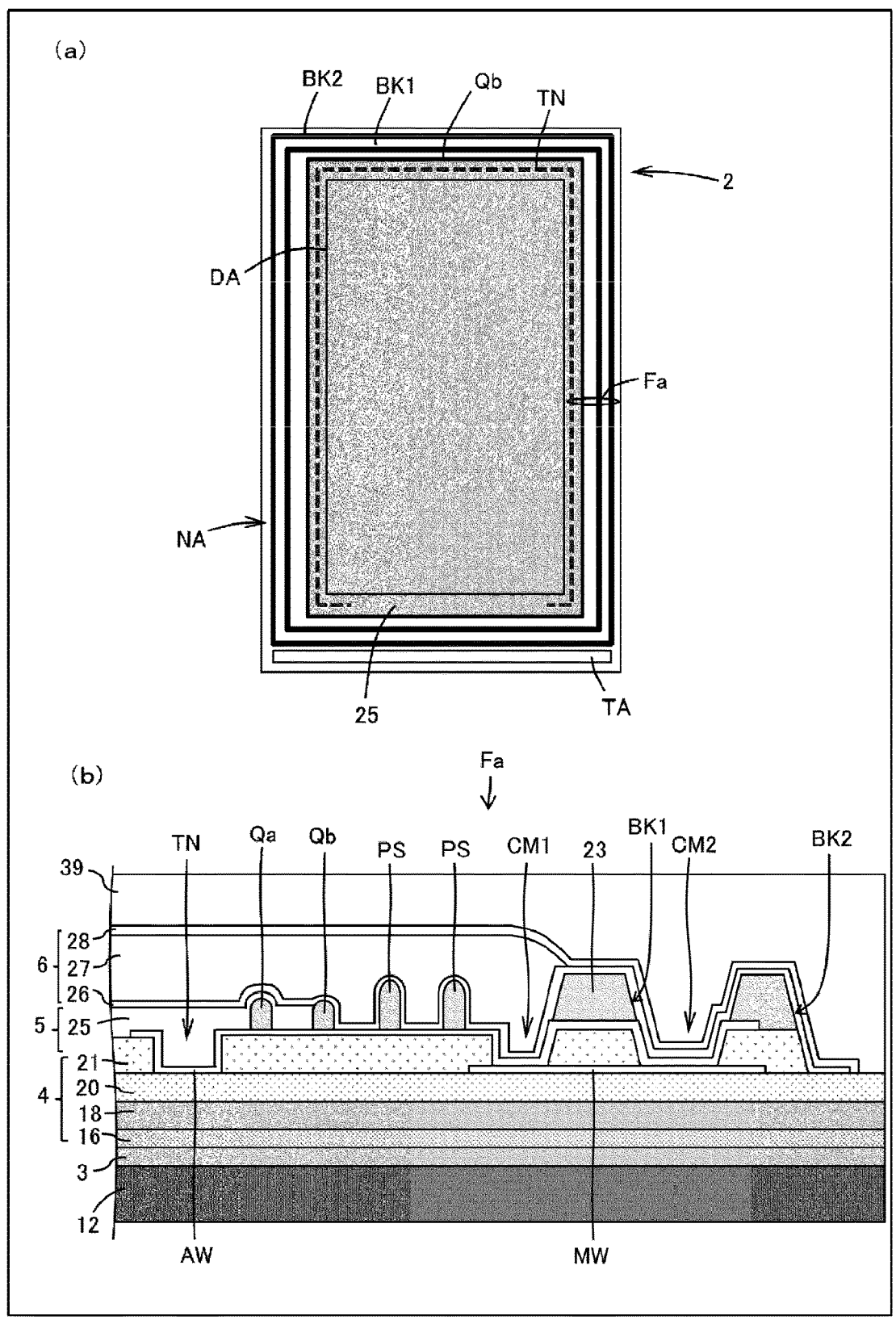
FIG. 6(a) is a plan view illustrating the configuration of the display device of the first embodiment.
FIG. 6(b) is a cross-sectional view of a side edge thereof.

FIG. 6(a) is a plan view illustrating the configuration of the display device of the first embodiment, and FIG. 6(b) is a cross-sectional view of the side edge thereof. As illustrated in FIG. 6, in the frame region NA, a trench TN is formed in the flattening film 21, and banks BK1 and BK2 that define an end portion of the organic film 27 are provided on the outer side of the trench TN.

In FIG. 6, a conductive film AW, which is formed of the same material in the same layer as the first electrode 22 of FIG. 1, is formed so as to straddle the trench TN and overlap with the bank BK2 provided on the outer side. In the trench TN, the edge cover film 23 is penetrated, and the second electrode 25 and the conductive film AW are in contact (electrically connected) with each other. Further, a power source trunk wiring line MW included in the third metal layer (in the same layer as the source wiring line SH in FIG. 1) is formed so as to overlap with the banks BK1 and BK2.

In a plan view, the trench TN surrounds the display region DA, the bank BK1 surrounds the trench TN, and the bank BK2 surrounds the bank BK1. The bank BK1 is formed by the flattening film 21 and the edge cover film 23, and is a liquid stopper structure that stops droplets when forming the organic film 27. The bank BK2 is a backup bank that stops the droplets from advancing beyond the bank BK1.

In a plan view, frame-shaped protruding portions Qa, Qb (a dual structure) constituted by the same material in the same layer as the edge cover film 23, and a plurality of photo spacers PS located on the outer side of the protruding portions Qa, Qb are provided between the trench TN and the bank BK1, and the protruding portion Qb defines an end portion of the second electrode 25. In other words, when applying the silver nanowire ink, which is the material of the second electrode 25, the protruding portion Qb serves as a liquid stopper. Note that a configuration may also be adopted in which the inner protruding portion Qa defines the end portion of the second electrode 25 (serves as the liquid stopper). The photo spacer PS is constituted by the edge cover film 23, and has a film thickness greater than that of the protruding portion Qa, Qb. An upper face of the photo spacer PS serves as a mask contact surface when forming a vapor deposition film on the first electrode 22 (see FIG. 1) (the protruding portions Qa, Qb do not come into contact with a mask). The frame-shaped protruding portions are not limited to having the dual structure, but may have a single structure.

A contact groove CM1 that penetrates the edge cover film 23 and the flattening film 21 is formed inside the bank BK1, a contact groove CM2 that penetrates the edge cover film 23 and the flattening film 21 is formed between the bank BK1 and the bank BK2, and the power source trunk wiring line MW is exposed in the contact grooves CM1 and CM2 and is in contact with the conductive film AW (the power source trunk wiring line MW and the conductive film AW are electrically connected to each other). A cathode electrode power supply voltage (ELVSS) is supplied from the power source trunk wiring line MW to the second electrode 25 via the conductive film AW.

Figure 7:
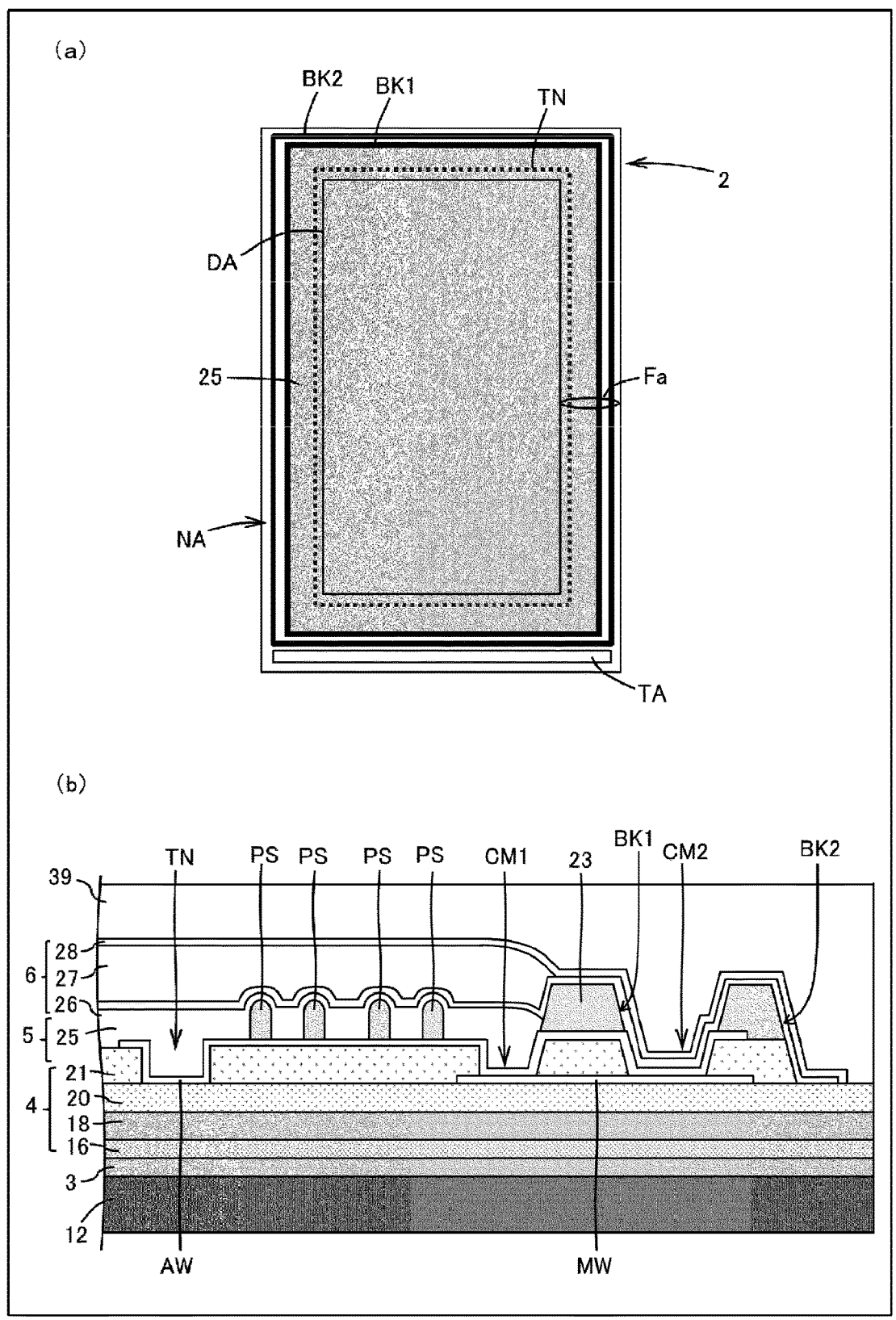
FIG. 7(a) is a plan view illustrating a first modified example of FIG. 6.
FIG. 7(b) is a cross-sectional view of a side edge thereof.

FIG. 7(a) is a plan view illustrating a first modified example of FIG. 6, and FIG. 7(b) is a cross-sectional view of a side edge thereof. As illustrated in FIG. 7, a configuration may also be adopted in which the bank BK1 defines the end portion of the second electrode 25. In other words, when applying the silver nanowire ink, the bank BK1 serves as the liquid stopper. Although the edge of the organic film 27 is defined by the bank BK1, the configuration is not limited thereto, and the edge of the organic film 27 may be defined by the bank BK2. Further, a frame-shaped bank surrounding the bank BK2 may be provided outside the bank BK2 (on a panel edge side).

Figure 8:
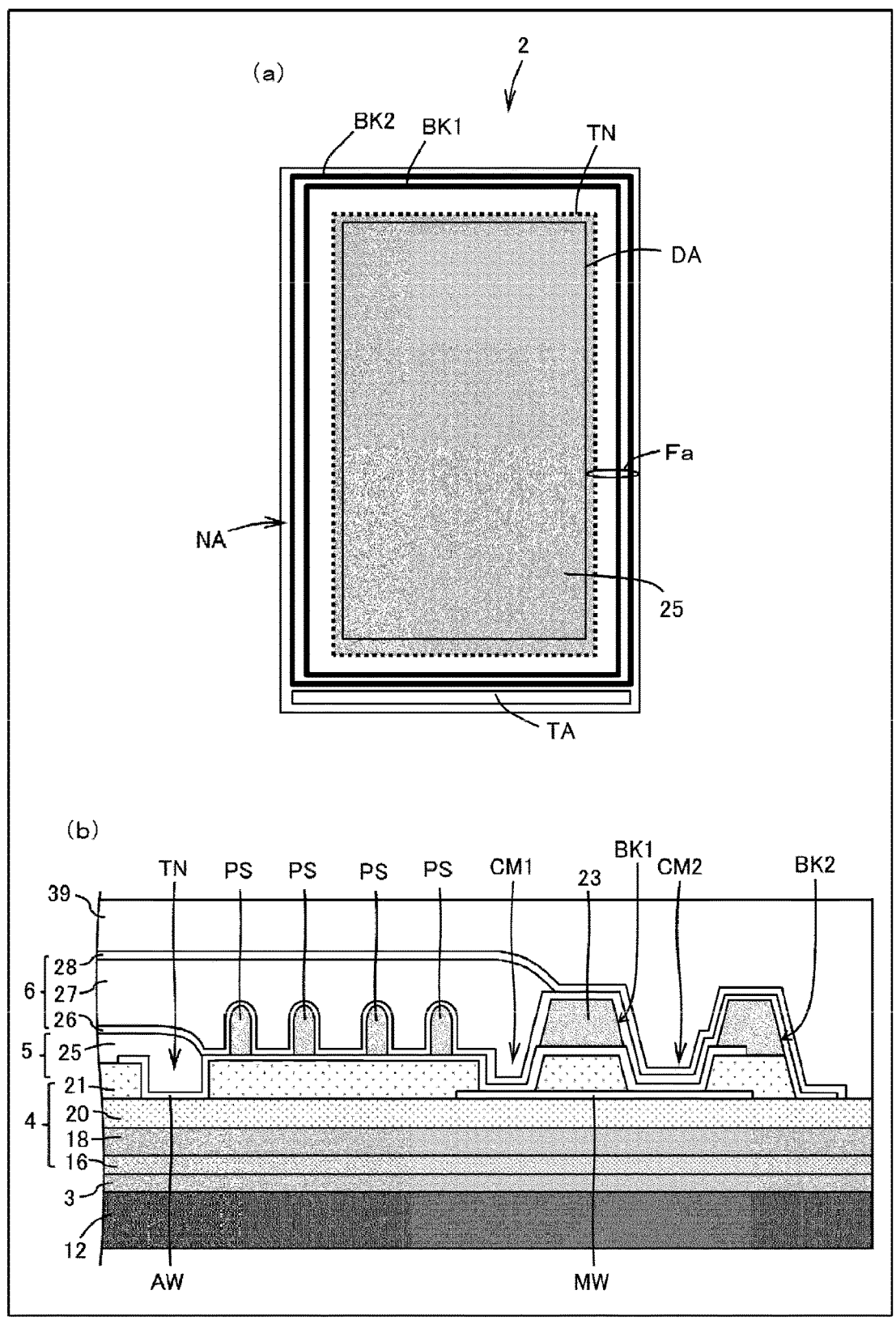
FIG. 8(a) is a plan view illustrating a second modified example of FIG. 6.
FIG. 8(b) is a cross-sectional view of a side edge thereof.

FIG. 8(a) is a plan view illustrating a second modified example of FIG. 6, and FIG. 8(b) is a cross-sectional view of a side edge thereof. As illustrated in FIG. 8, a configuration may also be adopted in which the trench TN defines the end portion of the second electrode 25. In other words, when applying the silver nanowire ink, the trench TN is filled with the silver nanowire ink, and serves as the liquid stopper.

Figure 9:
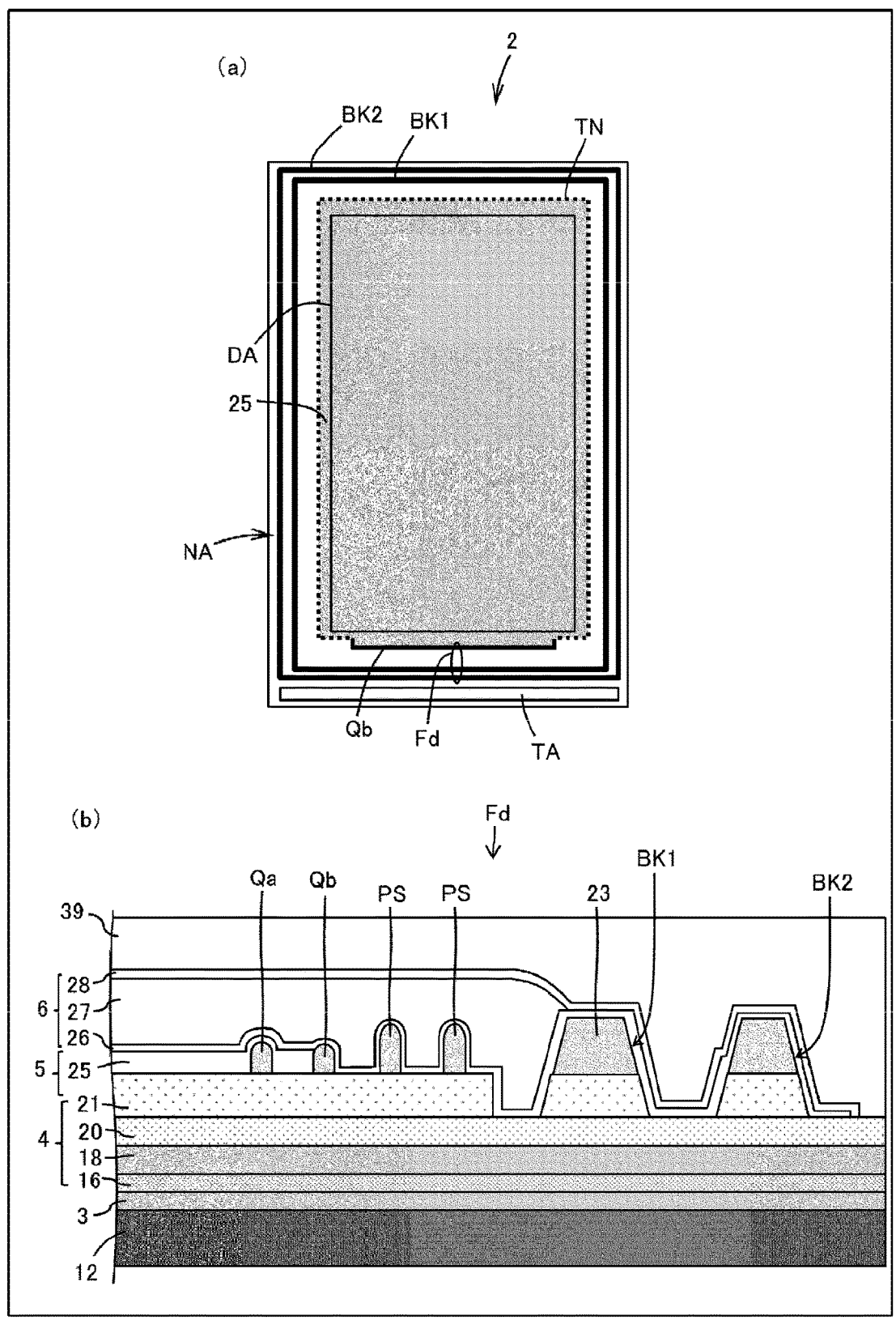
FIG. 9(a) is a plan view illustrating a third modified example of FIG. 6.
FIG. 9(b) is a cross-sectional view of a side edge thereof.

FIG. 9(a) is a plan view illustrating a third modified example of FIG. 6, and FIG. 9(b) is a cross-sectional view of a side edge thereof. As illustrated in FIG. 9, a configuration may also be adopted in which, of the four side edges surrounding the display region DA, in a central portion of the side edge Fd including the terminal portion TA, the protruding portions Qa, Qb are provided that define the end portion of the second electrode 25 without providing the trench, and in the remaining three side edges, the trench TN defines the end portion of the second electrode 25.

In other words, the trench TN is provided so as to surround, of the four sides of the display region DA, a portion of one side along the terminal portion TA and all of the other three sides, and in a section, of the end portion of the second electrode 25, along the one side, a portion of the section is defined by the protruding portion Qb, and another portion of the section is defined by the trench TN. Sections, of the end portion of the second electrode 25, along the other three sides are defined by the trench TN.

Second Embodiment

Figure 10:
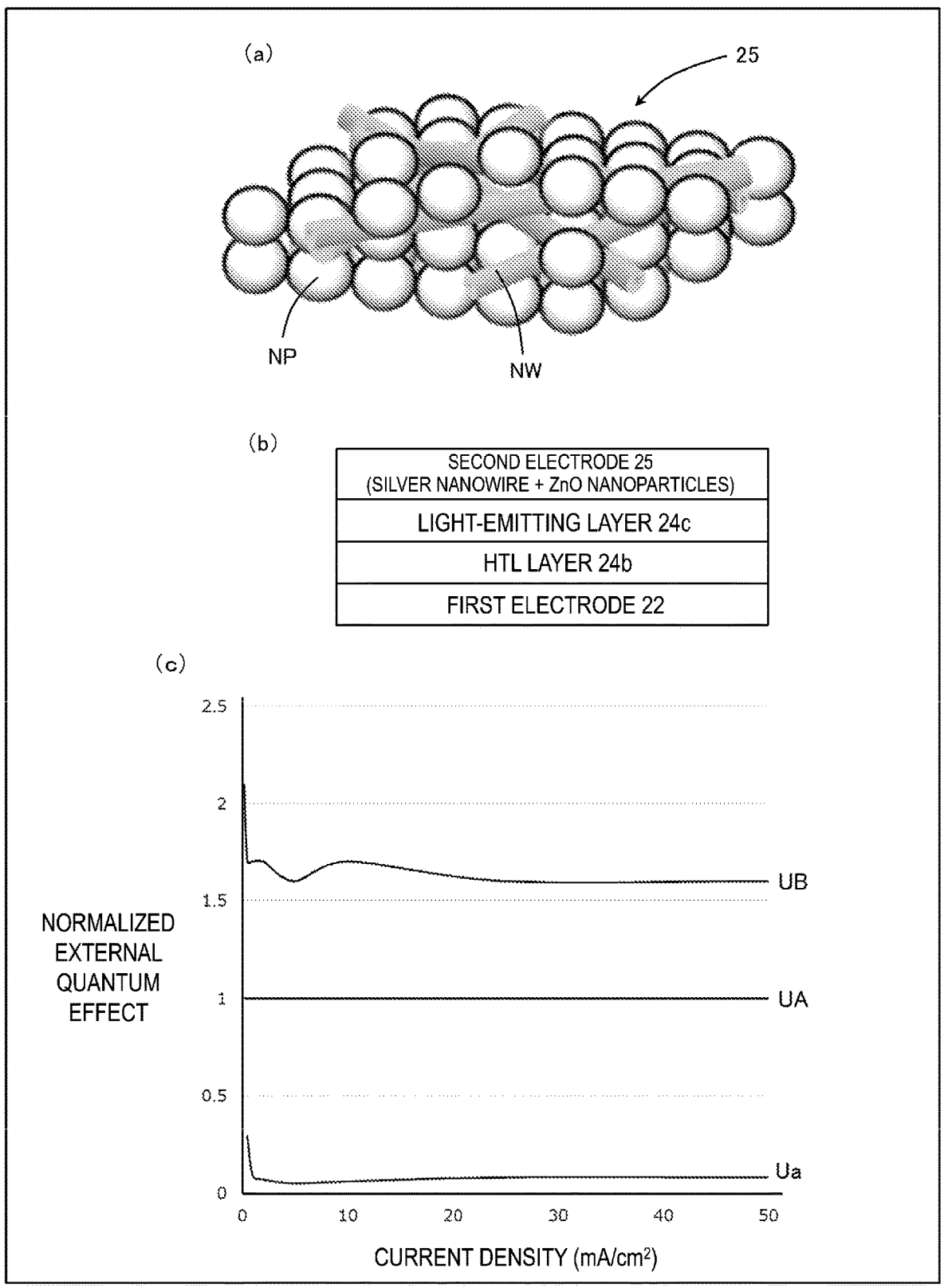
FIG. 10(a) is a schematic perspective view illustrating a configuration of the second electrode according to a second embodiment.
FIG. 10(b) is a schematic cross-sectional view illustrating a configuration of a light-emitting element according to the second embodiment.
FIG. 10(c) is a graph showing effects of the configurations of FIGS. 10(a) and (b).

FIG. 10(a) is a schematic perspective view illustrating a configuration of the second electrode according to a second embodiment, FIG. 10(b) is a schematic cross-sectional view illustrating a configuration of a light-emitting element according to the second embodiment, and FIG. 10(c) is a graph showing effects of the configurations of FIGS. 10(a) and (b). As illustrated in FIG. 10(a), the second electrode 25 may be constituted to include silver nanowires, and zinc oxide (ZnO) nanoparticles, which are an electron transport material. The second electrode 25 is obtained in which the silver nanowires and the zinc oxide nanoparticles are mixed, by applying and drying a liquid obtained by mixing silver nanowire dispersion and zinc oxide nanoparticle dispersion at a desired ratio, and stirring the mixed dispersion. Specifically, a configuration is used in which the silver nanowires NW are arranged three-dimensionally in a random manner, and the silver nanowires NW pass through gaps between zinc oxide nanoparticles NP (having an average particle size of 1 to 30 nm). As illustrated in FIG. 10(b), the light-emitting element of the second embodiment has a configuration in which the first electrode 22 (anode electrode), the HTL layer 24b, the light-emitting layer 24c (the quantum dot light-emitting layer, for example), and the second electrode (common cathode electrode) are provided in this order.

In the configuration of FIG. 10(a), since the contact area, in the second electrode 25, between the silver nanowires NW and the zinc oxide nanoparticles NP, which are the electron transport material, increases, as illustrated in FIG. 10(c), it can be seen that, in a range from 0 to 50 (mA per square centimeter) of the current density, an external quantum effect UB (a normalized value with respect to a reference value) of the light-emitting element of the second embodiment is significantly improved, compared with an external quantum effect UA (the reference value when each of the current densities is 1) of the light-emitting element in the configuration illustrated in FIG. 2(b), that is, the light-emitting element in which the silver nanowire layer is formed on the ETL layer (the zinc oxide nanoparticle layer) as the second electrode, and a normalized external quantum efficiency Ua (a normalized value with respect to the reference value) of a light-emitting element including a generic cathode electrode of a silver thin film.

Further, compared to a case in which the ETL layer and the second electrode (common cathode electrode) are formed separately at different steps, the number of steps can be reduced.

If the metal nanowires NW are provided excessively, the electron transport capability to the light-emitting layer deteriorates, and if the metal nanowires NW are provided insufficiently, the resistance value increases. Thus, the volume ratio of the metal nanowires NW with respect to the ZnO nanoparticles NP is preferably from 1/49 to 1/9, and more preferably from 1/25 to 1/15.

The embodiments described above are intended to provide illustrations and descriptions, and are not intended to limit the disclosure. Based on these illustrations and descriptions, it is apparent to those skilled in the art that many modified configurations are possible.

Supplement

First Aspect

A display device includes a display region and a frame region surrounding the display region. The display device includes a TFT layer, a light-emitting element layer formed with a plurality of light-emitting elements each including a first electrode, a light-emitting layer, and a second electrode, and having a luminescent color different from each other, and a sealing layer including an organic film and configured to seal the light-emitting element layer. The second electrode is an electrode common to the plurality of light-emitting elements, and includes metal nanowires which are mesh-shaped.

Second Aspect

In the display device, for example, according to the first aspect, a flattening film is included in the TFT layer, a trench is formed in the flattening film in the frame region, and a bank defining an end portion of the organic film is provided at an outer side of the trench.

Third Aspect

In the display device, for example, according to the second aspect, a protruding portion positioned between the trench and the bank in a plan view is formed in a frame-like shape surrounding the display region, and the protruding portion defines an end portion of the second electrode.

Fourth Aspect

The display device, for example, according to the third aspect includes a photo spacer positioned between the protruding portion and the bank in a plan view.

Fifth Aspect

In the display device, for example, according to the fourth aspect, a film thickness of the protruding portion is smaller than a film thickness of the photo spacer.

Sixth Aspect

In the display device, for example, according to any one of the third to fifth aspects, the light-emitting element layer includes an edge cover film covering an edge of the first electrode on the flattening film, and the protruding portion is formed of a material identical to a material of the edge cover film in a layer identical to a layer of the edge cover film.

Seventh Aspect

In the display device, for example, according to any one of the second to sixth aspects, a conductive film formed of a material identical to a material of the first electrode in a layer identical to a layer of the first electrode is provided straddling the trench, and the conductive film and the second electrode are in contact with each other inside the trench.

Eighth Aspect

In the display device, for example, according to any one of the second to seventh aspects, a trunk wiring line is provided in a lower layer than the flattening film in the frame region, a contact groove configured to expose the trunk wiring line is provided in the flattening film on an inner side, closer to the display region, of the bank, and the second electrode is electrically connected to the trunk wiring line.

Ninth Aspect

In the display device, for example, according to the second aspect, the bank defines an end portion of the second electrode.

Tenth Aspect

In the display device, for example, according to the second aspect, the trench defines an end portion of the second electrode.

Eleventh Aspect

In the display device, for example, according to the tenth aspect, the trench is provided in a frame-like shape surrounding an entire periphery of the display region.

Twelfth Aspect

In the display device, for example, according to the third aspect, a terminal portion including a plurality of terminals is provided in the frame region, the trench is provided surrounding, of four sides of the display region, a portion of one side along the terminal portion and all of other three sides, a partial section, along the one side, of the end portion of the second electrode is defined by the protruding portion, and another partial section, along the one side, of the end portion of the second electrode is defined by the trench, and sections, along the three sides, of the end portion of the second electrode are defined by the trench.

Thirteenth Aspect

In the display device, for example, according to any one of the first to twelfth aspects, a terminal portion including a plurality of terminals is provided in the frame region, and a length of a metal nanowire of the metal nanowires is less than a distance between terminals adjacent to each other.

Fourteenth Aspect

In the display device, for example, according to any one of the first to thirteenth, the organic film is formed above the second electrode.

Fifteenth Aspect

In the display device, for example, according to any one of the first to fourteenth aspects, the light-emitting layer is a quantum dot light-emitting layer.

Sixteenth Aspect

In the display device, for example, according to any one of the first to fifteenth aspects, the light-emitting layer is an organic light-emitting layer.

Seventeenth Aspect

In the display device, for example, according to any one of the first to sixteenth aspects, a light transmittance of the second electrode is not less than 80%.

Eighteenth Aspect

In the display device, for example, according to any one of the first to seventeenth aspects, a metal nanowire of the metal nanowires includes at least one of Ag, Au, Al, or Cu.

Nineteenth Aspect

In the display device, for example, according to any one of the first to eighteenth aspects, the first electrode is an anode electrode, the second electrode is a cathode electrode, and the second electrode includes an electron transport material.

Twentieth Aspect

In the display device, for example, according to the nineteenth aspect, the second electrode is in contact with the light-emitting layer.

Twenty-First Aspect

In the display device, for example, according to the nineteenth or twentieth aspect, the electron transport material includes zinc oxide nanoparticles.

Twenty-Second Aspect

In the display device, for example, according to the twenty-first aspect, a volume ratio of the metal nanowires to the zinc oxide nanoparticles ranges from 1/49 to 1/9.

Twenty-Third Aspect

A method for manufacturing a display device including a TFT layer, a light-emitting element layer formed with a plurality of light-emitting elements each including a first electrode, a light-emitting layer, and a second electrode, and having a luminescent color different from each other, and a sealing layer including an organic film and configured to seal the light-emitting element layer is a method including forming a second electrode by applying an ink containing metal nanowires dispersed in a solvent, and removing the solvent.

REFERENCE SIGNS LIST

2 Display device
4 TFT layer
21 Flattening film
22 First electrode
23 Edge cover film
24 EL layer (including light-emitting layer)
25 Second electrode
BK1, BK2 Bank
Xr, Xg, Xb Light-emitting element
Qa, Qb Protruding portion
PS Photo spacer
TN Trench
CM Contact groove
AW Conductive film
MW Power source trunk wiring line
NW Silver nanowire
NP Zinc oxide nanoparticle
DA Display region
NA Frame region

The invention claimed is:

1. A display device including a display region and a frame region surrounding the display region, the display device comprising:
   a thin film transistor (TFT) layer;
   a light-emitting element layer formed with a plurality of light-emitting elements, each of the plurality of light-emitting elements including a first electrode, a light-emitting layer, and a second electrode, and having a luminescent color different from other light-emitting elements of the plurality of light-emitting elements; and
   a sealing layer including an organic film and configured to seal the light-emitting element layer,
   wherein the second electrode is an electrode common to the plurality of light-emitting elements, and includes metal nanowires which are mesh-shaped,
   a flattening film is included in the TFT layer,
   a trench is formed in the flattening film in the frame region,
   a bank, defining an end portion of the organic film, is provided at an outer side of the trench,
   a protruding portion, positioned between the trench and the bank in a plan view, is formed in a frame-like shape surrounding the display region, and
   the protruding portion defines an end portion of the second electrode.

2. The display device according to claim 1, further comprising:
   a photo spacer positioned between the protruding portion and the bank in the plan view.

3. The display device according to claim 2,
   wherein a film thickness of the protruding portion is smaller than a film thickness of the photo spacer.

4. The display device according to claim 1,
   wherein the light-emitting element layer includes an edge cover film covering an edge of the first electrode on the flattening film, and
   the protruding portion is formed of a material identical to a material of the edge cover film in a layer identical to a layer of the edge cover film.

5. The display device according to claim 1,
wherein a conductive film, formed of a material identical to a material of the first electrode in a layer identical to a layer of the first electrode, is provided straddling the trench, and
the conductive film and the second electrode are in contact with each other inside the trench.

6. The display device according to claim 1,
wherein a trunk wiring line is provided in a lower layer than the flattening film in the frame region,
a contact groove, configured to expose the trunk wiring line, is provided in the flattening film on an inner side, closer to the display region, of the bank, and
the second electrode is electrically connected to the trunk wiring line.

7. The display device according to claim 1,
wherein a terminal portion, including a plurality of terminals, is provided in the frame region,
the trench is provided surrounding, of four sides of the display region, a portion of one side along the terminal portion and all of other three sides,
a partial section, along the one side, of the end portion of the second electrode is defined by the protruding portion, and another partial section, along the one side, of the end portion of the second electrode is defined by the trench, and
sections, along the other three sides, of the end portion of the second electrode are defined by the trench.

8. The display device according to claim 1,
wherein a terminal portion, including a plurality of terminals, is provided in the frame region, and
a length of a metal nanowire of the metal nanowires is less than a distance between terminals, among the plurality of terminals, that are adjacent to each other.

9. The display device according to claim 1,
wherein the organic film is formed above the second electrode.

10. The display device according to claim 1,
wherein the light-emitting layer is a quantum dot light-emitting layer.

11. A display device including a display region and a frame region surrounding the display region, the display device comprising:
a thin film transistor (TFT) layer;
a light-emitting element layer formed with a plurality of light-emitting elements, each of the plurality of light-emitting elements including a first electrode, a light-emitting layer, and a second electrode, and having a luminescent color different from other light-emitting elements of the plurality of light-emitting elements; and
a sealing layer including an organic film and configured to seal the light-emitting element layer,
wherein the second electrode is an electrode common to the plurality of light-emitting elements, and includes metal nanowires which are mesh-shaped,
a flattening film is included in the TFT layer,
a trench is formed in the flattening film in the frame region,
a bank, defining an end portion of the organic film, is provided at an outer side of the trench, and
the bank defines an end portion of the second electrode.

12. The display device according to claim 11,
wherein a terminal portion, including a plurality of terminals, is provided in the frame region, and
a length of a metal nanowire of the metal nanowires is less than a distance between terminals, among the plurality of terminals, that are adjacent to each other.

13. The display device according to claim 11,
wherein the organic is film is formed above the second electrode.

14. The display device according to claim 11,
wherein the light-emitting layer is a quantum dot light-emitting layer.

15. A display device including a display region and a frame region surrounding the display region, the display device comprising:
a thin film transistor (TFT) layer;
a light-emitting element layer formed with a plurality of light-emitting elements, each of the plurality of light-emitting elements including a first electrode, a light-emitting layer, and a second electrode, and having a luminescent color different from each other; and
a sealing layer including an organic film and configured to seal the light-emitting element layer,
wherein the second electrode is an electrode common to the plurality of light-emitting elements, and includes metal nanowires which are mesh-shaped,
a flattening film is included in the TFT layer,
a trench is formed in the flattening film in the frame region,
a bank, defining an end portion of the organic film, is provided at an outer side of the trench, and
the trench defines an end portion of the second electrode.

16. The display device according to claim 15,
wherein the trench is provided in a frame-like shape surrounding an entire periphery of the display region.

17. The display device according to claim 15,
wherein a terminal portion, including a plurality of terminals, is provided in the frame region, and
a length of a metal nanowire of the metal nanowires is less than a distance between terminals, among the plurality of terminals, that are adjacent to each other.

18. The display device according to claim 15,
wherein the organic film is formed above the second electrode.

19. The display device according to claim 15,
wherein the light-emitting layer is a quantum dot light-emitting layer.

* * * * *